US012588326B2

(12) United States Patent
Wildeson et al.

(10) Patent No.: US 12,588,326 B2
(45) Date of Patent: Mar. 24, 2026

(54) COMPOSITE CATHODE CONTACT FOR MONOLITHICALLY INTEGRATED MICRO-LEDS, MINI-LEDS AND LED ARRAYS

(71) Applicant: Lumileds LLC, San Jose, CA (US)

(72) Inventors: Isaac Wildeson, Nashua, NH (US); Hossein Lotfi, Folsom, CA (US); Toni Lopez, Vaals (NL)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 526 days.

(21) Appl. No.: 17/981,859

(22) Filed: Nov. 7, 2022

(65) Prior Publication Data

US 2023/0155065 A1     May 18, 2023

Related U.S. Application Data

(60) Provisional application No. 63/278,645, filed on Nov. 12, 2021.

(51) Int. Cl.
H10H 20/831     (2025.01)
H01L 25/075     (2006.01)
(Continued)

(52) U.S. Cl.
CPC ..... H10H 20/8312 (2025.01); H01L 25/0753 (2013.01); H10H 20/01 (2025.01);
(Continued)

(58) Field of Classification Search
CPC .. H10H 20/8312; H10H 20/01; H10H 20/832; H10H 20/857; H10H 20/032;
(Continued)

(56) References Cited

U.S. PATENT DOCUMENTS 6,410,942 B1     6/2002  Thibeault et al.
6,657,236 B1     12/2003  Thibeault et al.
(Continued)

FOREIGN PATENT DOCUMENTS

DE     102010051286 A1     5/2012
DE     102012109460 A1     4/2014
(Continued)

OTHER PUBLICATIONS

PCT International Search Report and Written Opinion in PCT/US2022/049345 dated Mar. 24, 2023, 9 pages.
(Continued)

*Primary Examiner* — Shahed Ahmed
(74) *Attorney, Agent, or Firm* — Servilla Whitney LLC

(57) ABSTRACT

An LED device comprises a mesa comprising semiconductor layers, the semiconductor layers including an N-type layer, an active layer, and a P-type layer, the mesa having a top surface and at least one side wall, the at least one side wall defining a trench have a bottom surface. A transparent conductive layer is on at least one side wall and in the trench. A cathode layer is in the trench on the transparent conductive layer. A p-type contact is on the top surface of the mesa. In some embodiments, a spacer layer is formed between the transparent conductive layer and the cathode layer. In other embodiments, a distributed Bragg reflector is formed between the transparent conductive layer and the cathode layer.

19 Claims, 11 Drawing Sheets

(51) Int. Cl.

| | |
|---|---|
| *H10H 20/01* | (2025.01) |
| *H10H 20/832* | (2025.01) |
| *H10H 20/841* | (2025.01) |
| *H10H 20/857* | (2025.01) |

(52) U.S. Cl.
CPC ........ *H10H 20/832* (2025.01); *H10H 20/841* (2025.01); *H10H 20/857* (2025.01); *H10H 20/032* (2025.01); *H10H 20/034* (2025.01); *H10H 20/0364* (2025.01)

(58) Field of Classification Search
CPC ............. H10H 20/0364; H10H 20/833; H10H 20/00–882; H10H 29/00–142; H10H 29/30–962; H01L 25/0753; H10F 77/244–254; H10F 71/138–1385
See application file for complete search history.

(56) References Cited

U.S. PATENT DOCUMENTS

| | | | |
|---|---|---|---|
| 6,821,804 | B2 | 11/2004 | Thibeault et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,890,111 | B2 | 11/2014 | Templier et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | B2 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,964,845 | B2 | 3/2021 | Dimitropoulos et al. |
| 11,574,586 | B1 * | 2/2023 | Pappas ................... H03K 3/037 |
| 2006/0227531 | A1 | 10/2006 | Iou |
| 2011/0151607 | A1 | 6/2011 | Landis et al. |
| 2011/0287606 | A1 | 11/2011 | Brun et al. |
| 2011/0297914 | A1 | 12/2011 | Zheng |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0155331 | A1 | 6/2015 | Guenard |
| 2015/0228873 | A1 | 8/2015 | Gebuhr et al. |
| 2015/0280060 | A1 | 10/2015 | Gilet et al. |
| 2015/0380461 | A1 | 12/2015 | Robin et al. |
| 2016/0005917 | A1 | 1/2016 | Jung et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |

| | | | |
|---|---|---|---|
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0243860 | A1 | 8/2017 | Hong et al. |
| 2017/0293065 | A1 | 10/2017 | Kim |
| 2017/0331020 | A1 | 11/2017 | Oh et al. |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0047929 | A1 | 2/2018 | Kim et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0122996 | A1 | 5/2018 | He et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |
| 2019/0088820 | A1 | 3/2019 | Danesh et al. |
| 2020/0395509 | A1 | 12/2020 | Nishiyama |
| 2021/0288222 | A1 | 9/2021 | Young et al. |
| 2021/0288223 | A1 | 9/2021 | Young et al. |
| 2021/0384182 | A1 * | 12/2021 | Xu ....................... H10H 20/855 |
| 2022/0384516 | A1 * | 12/2022 | Tan ......................... H01L 25/18 |

FOREIGN PATENT DOCUMENTS

| | | | |
|---|---|---|---|
| DE | 102014112551 | A1 | 3/2016 |
| EP | 1378949 | A1 | 1/2004 |
| EP | 2027608 | A1 | 2/2009 |
| EP | 2203939 | A1 | 7/2010 |
| EP | 2211387 | A2 | 7/2010 |
| EP | 2339658 | A2 | 6/2011 |
| EP | 2491591 | A1 | 8/2012 |
| EP | 2499958 | A1 | 9/2012 |
| EP | 2521161 | A1 | 11/2012 |
| EP | 2521162 | A1 | 11/2012 |
| EP | 2553149 | A1 | 2/2013 |
| EP | 2617069 | A1 | 7/2013 |
| EP | 2674516 | A1 | 12/2013 |
| EP | 2855744 | B1 | 5/2016 |
| EP | 3053199 | A1 | 8/2016 |
| EP | 3144272 | A1 | 3/2017 |
| EP | 2006921 | B1 | 12/2018 |
| EP | 3410002 | A1 | 12/2018 |
| EP | 3410003 | A1 | 12/2018 |
| EP | 2710634 | B1 | 10/2020 |
| FR | 2952366 | A1 | 5/2011 |
| FR | 2964796 | A1 | 3/2012 |
| FR | 2969995 | A1 | 7/2012 |
| FR | 2972815 | A1 | 9/2012 |
| FR | 2974940 | A1 | 11/2012 |
| FR | 2974941 | A1 | 11/2012 |
| FR | 2975532 | A1 | 11/2012 |
| FR | 2991342 | A1 | 12/2013 |
| FR | 2991999 | A1 | 12/2013 |
| FR | 2998090 | A1 | 5/2014 |
| FR | 3011383 | A1 | 4/2015 |
| FR | 3041274 | A1 | 3/2017 |
| FR | 3046155 | A1 | 6/2017 |
| FR | 3052915 | A1 | 12/2017 |
| JP | 2011071272 | A | 4/2011 |
| JP | 2013229638 | A | 11/2013 |

(56) References Cited

FOREIGN PATENT DOCUMENTS

| | | | |
|---|---|---|---|
| JP | 2015119014 | A | 6/2015 |
| JP | 2016066765 | A | 4/2016 |
| JP | 2017118031 | A | 6/2017 |
| KR | 20140118466 | A | 10/2014 |
| KR | 20160064363 | A | 6/2016 |
| KR | 20170018687 | A | 2/2017 |
| KR | 20180010670 | A | 1/2018 |
| KR | 20180114413 | A | 10/2018 |
| KR | 20200133775 | A | 11/2020 |
| TW | 201417339 | A | 5/2014 |
| TW | 201620163 | A | 6/2016 |
| WO | 2006138465 | A2 | 12/2006 |
| WO | 2011045289 | A1 | 4/2011 |
| WO | 2011048318 | A1 | 4/2011 |
| WO | 2012035243 | A1 | 3/2012 |
| WO | 2012156620 | A2 | 11/2012 |
| WO | 2013182969 | A1 | 12/2013 |
| WO | 2015044620 | A1 | 4/2015 |
| WO | 2016079505 | A1 | 5/2016 |
| WO | 2017068029 | A1 | 4/2017 |
| WO | 2017102708 | A1 | 6/2017 |
| WO | 2017184686 | A1 | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019092357 | A1 | 5/2019 |
| WO | 2019126539 | A1 | 6/2019 |
| WO | 2021183415 | A1 | 9/2021 |

OTHER PUBLICATIONS

PCT International Search Report and Written Opinion in PCT/US2022/049347 dated Apr. 3, 2023, 9 pages.

PCT International Search Report and Written Opinion in PCT/US2022/049348 dated Apr. 3, 2023, 10 pages.

Zhang, Yanfang , et al., "Low-threshold ultraviolet stimulated emissions from large-sized single crystalline ZnO transferable membranes", Optics Express, vol. 26, No. 24, Nov. 26, 2018.

Non-Final Office Action in U.S. Appl. No. 17/981,906 dated Feb. 28, 2025, 22 pages.

"Non-Final Office Action in U.S. Appl. No. 17/981,906 dated Jan. 23, 2026, 28 pages".

* cited by examiner

500

700

702 — Deposit Semiconductor Layers

704 — Etch the Semiconductor Layers to Form First Mesa and Second Mesa

706 — Deposit Dielectric Layer

708 — Remove Portion of Dielectric Layer

710 — Deposit Transparent Conductive Layer

712 — Deposit Distributed Bragg Reflector

714 — Deposit Cathode Layer

1

COMPOSITE CATHODE CONTACT FOR MONOLITHICALLY INTEGRATED MICRO-LEDS, MINI-LEDS AND LED ARRAYS

CROSS-REFERENCE TO RELATED APPLICATIONS

This application claims priority to U.S. Provisional Application No. 63/278,645, filed Nov. 12, 2021, the entire disclosure of which is hereby incorporated by reference herein.

TECHNICAL FIELD

Embodiments of the disclosure generally relate to arrays of light emitting diode (LED) devices and methods of manufacturing the same. More particularly, embodiments are directed to arrays of light emitting diode devices comprising composite cathode contacts.

BACKGROUND

A light emitting diode (LED) is a semiconductor light source that emits visible light when current flows through it. LEDs combine a P-type semiconductor with an N-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire, silicon (Si), or silicon carbide (SiC).

Inorganic light emitting diodes (i-LEDs) have been widely used to create different types of displays, LED matrices, and light engines including automotive adaptive headlights, augmented-, virtual-, mix-reality (AR/VR/MR) headsets, smart glasses, and displays for mobile phones, smart watches, monitors, and televisions. The individual LED pixels in these architectures could have an area of a few square millimeters down to few square micrometers, depending upon the matrix or display size and its pixel per inch requirements. One common approach is to create a monolithic array of LED pixels on an EPI wafer and later transfer and hybridize these LED arrays to a backplane to control individual pixels.

Monolithic arrays require metal side-contacts that serve as the electrical cathode for each pixel and also provide reflective sidewalls in between the pixels to reduce light scattering and propagation in lateral directions. In these architectures, the substrate (e.g., sapphire, silicon) should be removed after the LED array is integrated with the backplane controller to enhance light extraction and beam profiling. The standard approach to remove a sapphire substrate is by a laser lift-off process where a laser beam (UV laser in the case of Sapphire substrate) is used to detach the substrate from the epitaxial layers (in this case, LED arrays grown on the substrate). Since cathodes are entrenched down to the substrate's surface, they will interact with the laser beam from the laser lift-off process and create metal-rich droplets or other metal-containing by-products, which are generally absorptive and decrease light output. Impaired sidewall contacts may also affect the electrical performance of pixels and could result in unstable $V_f$ or electrical leakage development. Such effects could also pose long-term reliability concerns.

Accordingly, there is a need for monolithic LED arrays and fabrication processes that eliminate the laser's interaction with metallic layers during the laser lift-off of the substrate.

SUMMARY

Embodiments of the disclosure are directed to light emitting diode (LED) devices and methods for manufacturing LED devices. In an embodiment, a light emitting diode (LED) device comprises: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; a cathode layer in the trench on the transparent conductive layer; and a p-type contact on the top surface of the mesa.

Another aspect of the disclosure pertains to a method of manufacturing an LED device. In an embodiment, a method of manufacturing a light emitting diode (LED) device comprises: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a cathode layer in the trench and on the transparent conductive layer; and forming a p-type contact on the top surface of the at least one.

A further aspect pertains to a light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric, on the at least one side wall of the mesa and in the trench; a cathode layer on the zinc oxide layer; and a p-contact on the top surface of the mesa.

In another embodiment, a light emitting diode (LED) device comprises: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; a spacer layer on the transparent conductive layer; a cathode layer on the dielectric spacer layer; and a p-type contact on the top surface of the mesa.

Another aspect of the disclosure pertains to a method of manufacturing an LED device. In an embodiment, a method of manufacturing a light emitting diode (LED) device comprises: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a spacer layer on the transparent conductive layer; depositing a cathode layer on the transparent conductive layer; and forming a p-type contact on the top surface of the at least one mesa.

A further aspect pertains to a light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric layer, on the at least one side wall of the mesa, and in the trench; a spacer layer on the zinc oxide layer; a cathode layer on the spacer layer; and a p-contact on the top surface of the mesa.

In another embodiment, a light emitting diode (LED) device comprises: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; distributed Bragg reflector (DBR) on the transparent conductive layer; a cathode layer on the dielectric spacer layer; and a p-type contact on the top surface of the mesa.

Another aspect of the disclosure pertains to a method of manufacturing an LED device. In an embodiment, a method of manufacturing a light emitting diode (LED) device comprises: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a distributed Bragg reflector (DBR) on the transparent conductive layer; depositing a cathode layer on the transparent conductive layer; and forming a p-type contact on the top surface of the at least one mesa.

A further aspect pertains to a light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric layer, on the at least one side wall of the mesa, and in the trench; a distributed Bragg reflector (DBR) on the zinc oxide layer; a cathode layer on the spacer layer; and a p-contact on the top surface of the mesa.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
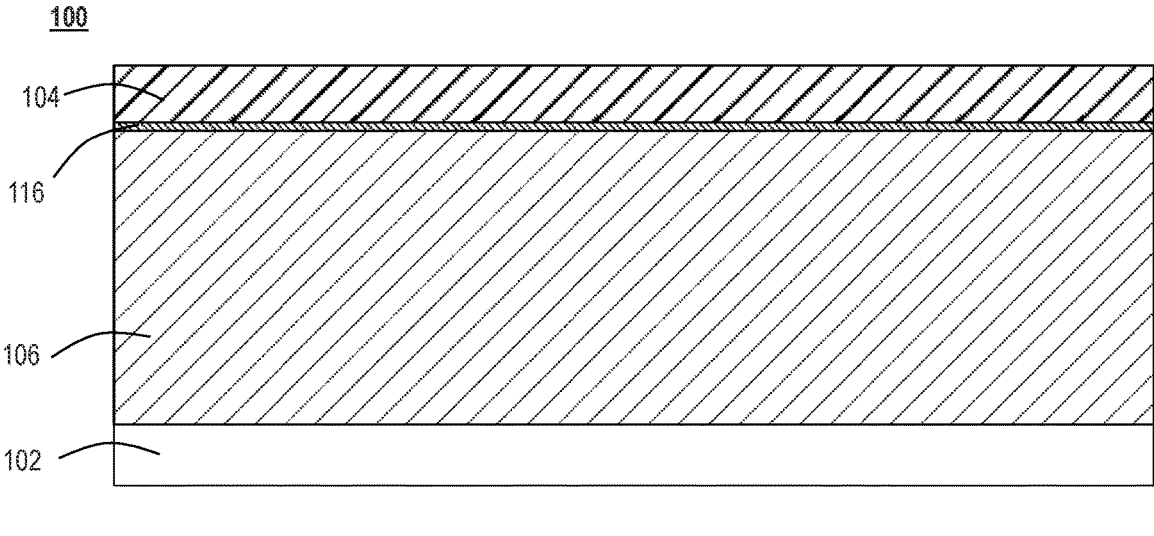
FIG. 1A illustrates a cross-sectional view of an LED device according to one or more embodiments.
Figure 1B:
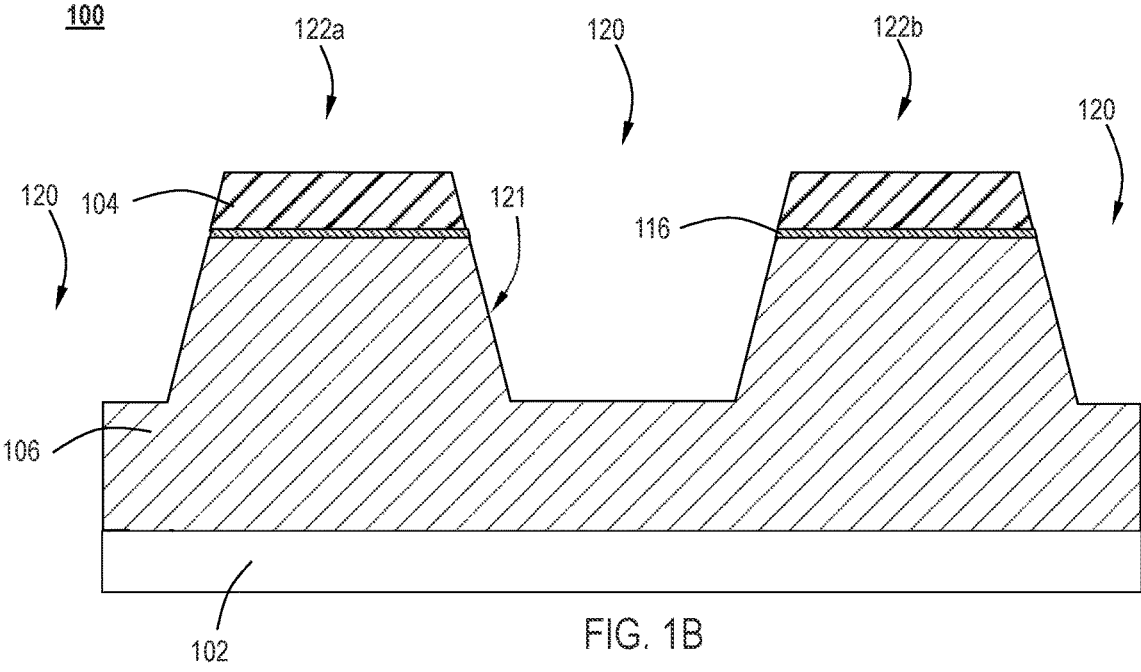
FIG. 1B illustrates a cross-sectional view of an LED device according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features, or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN, and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes improved, more uniform, and reproducible fabrication process for monolithic LED arrays that require laser lift-off for substrate removal by removing the laser lift-off laser's interaction with metallic layers. The LED devices of one or more embodiments advantageously have enhanced light output, improved electrical performance, and increased reliability. One or more embodiments describe improved uniformity/coverage and better optical and electrical properties for sidewall cathode contacts.

In one or more embodiments, an optically transparent and electrically conductive layer with a bandgap close to that of the epitaxial layer is incorporated at the bottom of the epitaxial structure. In some embodiments, the optically transparent layer may act as a protective layer for the metallic contact layers and prohibit a laser's interaction with the metallic layers. In one or more embodiments, the optically transparent layer comprises zinc oxide (ZnO). Zinc oxide has a high optical transmittance at visible wavelengths with a bandgap of 3.37 eV, which is close to that of gallium nitride (GaN, 3.4 eV). Having a bandgap close to GaN means that ZnO may absorb the laser beam in a similar manner to GaN and therefore can be separated from the sapphire substrate during laser lift-off step and can protect the metallic layers from the laser beam. In one or more embodiments, the thickness of transparent layer could be in the range of tens of nanometer to few hundred nanometers, which is thick enough to ensure that the laser beam is fully absorbed by the bottom section of this layer and does not reach the metallic layers.

The embodiments of the disclosure are described by way of the Figures, which illustrate devices (e.g., LEDs) and processes for forming devices in accordance with one or more embodiments of the disclosure. The processes shown are merely illustrative possible uses for the disclosed processes, and the skilled artisan will recognize that the disclosed processes are not limited to the illustrated applications.

Figure 5:
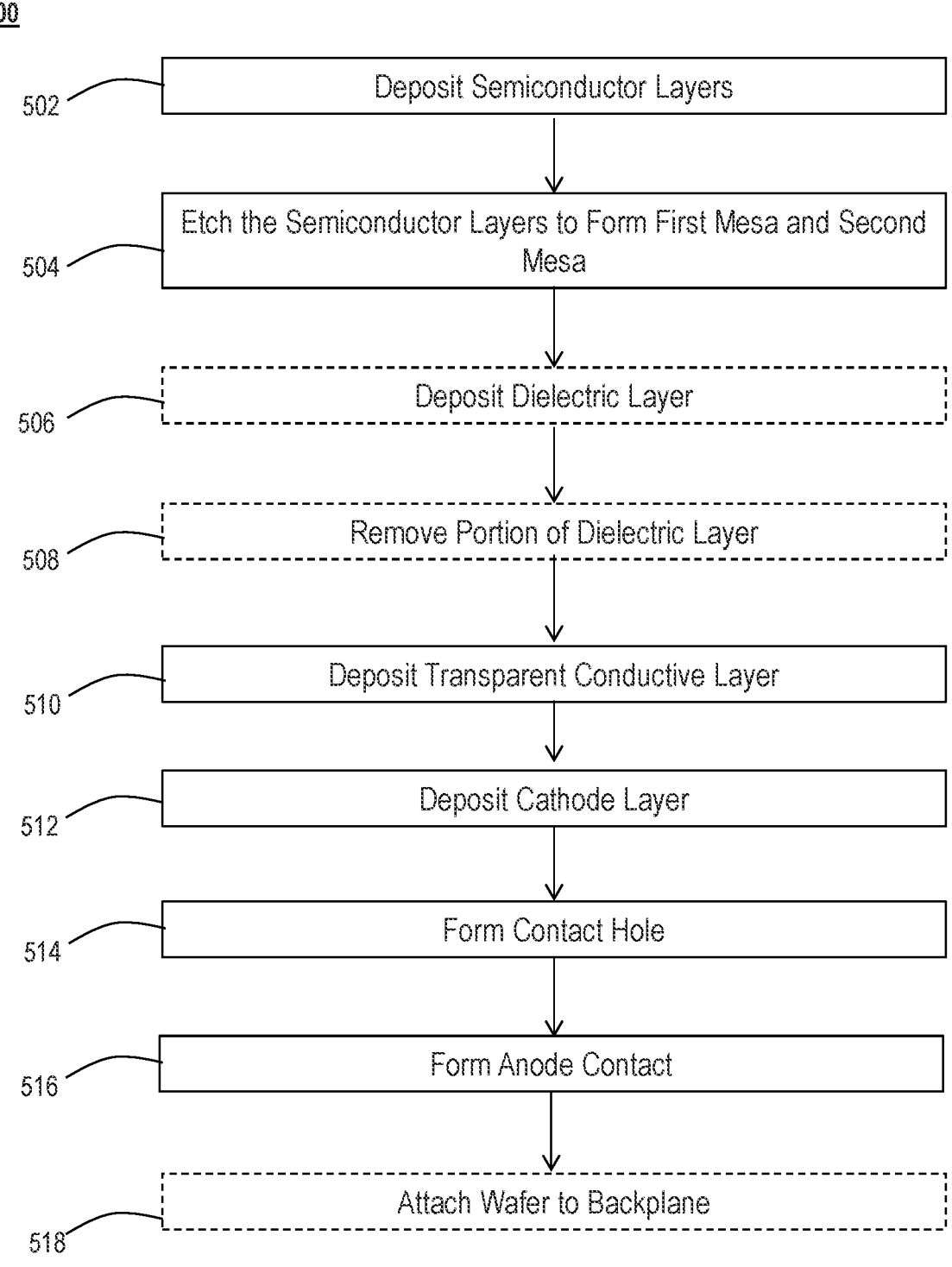
FIG. 5 illustrates a process flow diagram for a method of manufacturing an LED device according to one or more embodiments.

One or more embodiments of the disclosure are described with reference to the Figures. FIGS. 1A-1I illustrate cross-sectional views of a device 100 according to one or more embodiments. An aspect of the disclosure pertains to a method of manufacturing a LED array. FIG. 5 illustrates a process flow diagram of a method 500 of manufacturing an LED device. Referring to FIGS. 1A-1I and FIG. 5, a LED device 100 is manufactured containing an optically transparent and electrically conductive layer with a bandgap close to that of the epitaxial layer.

With reference to FIG. 1A and FIG. 5, in one or more embodiments, the first part of the epitaxy (operation 502) involves the growth of an n-type layer 106 and may be the same as in a conventional LED growth run using a sapphire or other applicable growth substrate 102. The substrate 102 may be any substrate known to one of skill in the art which is configured for use in the formation of LED devices. In one or more embodiments, the substrate 102 comprises one or more of sapphire, silicon carbide, silicon (Si), quartz, magnesium oxide (MgO), zinc oxide (ZnO), spinel, and the like. In one or more embodiments, the substrate 102 is a transparent substrate. In specific embodiments, the substrate 102 comprises sapphire. In one or more embodiments, the substrate 102 is not patterned prior to formation of the LEDs. Thus, in some embodiments, the substrate 102 is not patterned and can be considered to be flat or substantially flat. In other embodiments, the substrate 102 is a patterned substrate.

In one or more embodiments, the n-type layer 106 may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type layer 106 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type layer 106 comprises gallium nitride (GaN). In one or more embodiments, the n-type layer 106 is doped with n-type dopants, such as silicon (Si) or germanium (Ge). The n-type layer 106 may have a dopant concentration significant enough to carry an electric current laterally through the layer.

In one or more embodiments, the n-type layer 106 is deposited by one or more of sputter deposition, atomic layer deposition (ALD), metalorganic chemical vapor deposition (MOCVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g., a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e., two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein, according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. A particular subset of CVD processes commonly used in LED manufacturing use metalorganic precursor chemical and are referred to as MOCVD or metalorganic vapor phase epitaxy (MOVPE). As used herein, "substantially simultaneously"

refers to either co-flow or where there is overlap for a majority of exposures of the precursors.

As used herein, according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. In a PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g., a thin film on a substrate. Similarly, to a thermal ALD process, a purge step may be conducted between the deliveries of each of the reactants.

As used herein, according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, a LED device 100 is manufactured by placing the substrate 102 in a metalorganic vapor-phase epitaxy (MOVPE) reactor so that the LED device layers are grown epitaxially.

In one or more embodiments, after the growth of the n-type layers 106, an active region 116, and p-type layers 104 are grown using deposition techniques known to one of skill in the art. In one or more embodiments, the p-type layers 104 comprise gallium nitride (GaN).

Referring to FIGS. 1B-1D and FIG. 5, at operation 504, a plurality of mesas is formed by etching a first mesa 122a and a second mesa 122b into the wafer. In one or more embodiments, the first mesa 122a and the second mesa 122b are separated by a trench 120. In some embodiments, the trench 120 may be formed using a conventional directional etching process, such as dry etching. The trench 120 may be any suitable depth and may extend from the top surface of the dielectric layer 108 through the n-type layer 106 to the substrate 102. The trench 120 may comprise at least one sidewall 121 and a bottom surface 123.

In one or more embodiments, the first mesa 122a may have a height (thickness) that is about the same as the height (thickness) of the second mesa 122b. In other embodiments, the first mesa 122a may have a height (thickness) that is different than the height (thickness of the second mesa 122b.

In one or more embodiments, the etched surface (trench 120) may have an angle of inclination up to 45 degrees. In some embodiments, the etched surface (trench 120) may be completely vertical.

Figure 1C:
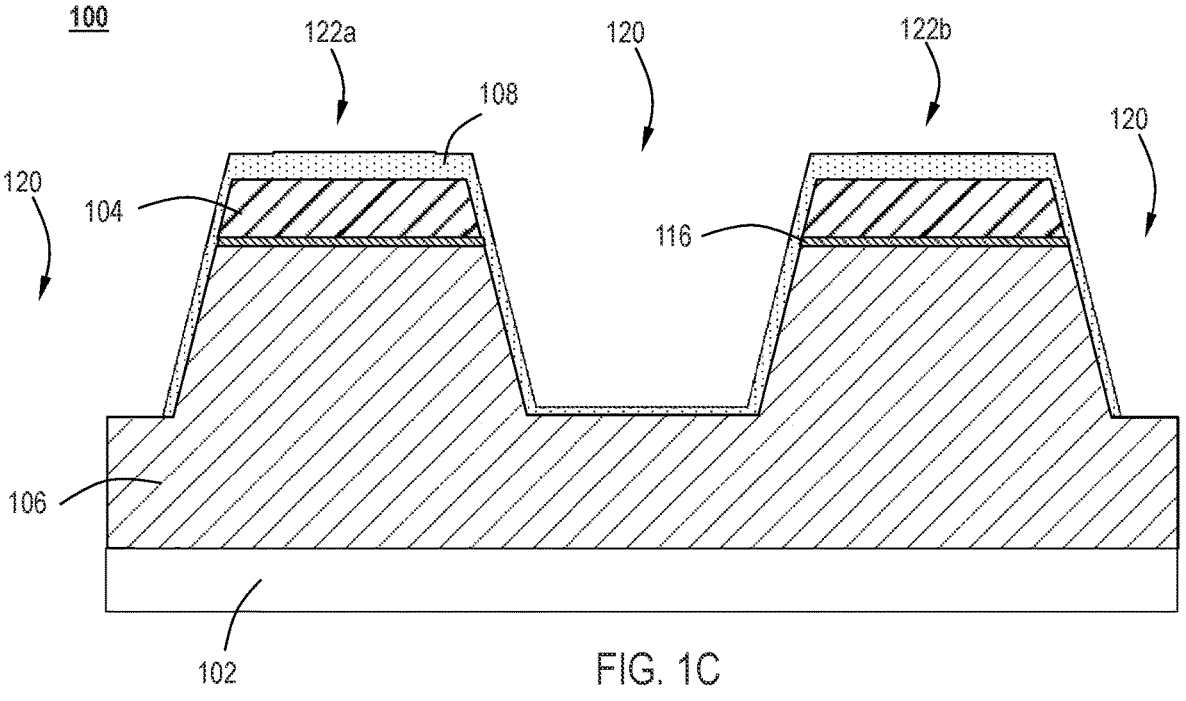
FIG. 1C illustrates a cross-sectional view of an LED device according to one or more embodiments.

FIG. 1C and FIG. 5, at operation 506, show formation of a dielectric layer 108 on the pluralities of mesas 122a, 122b and in the trench 120. The dielectric layer 108 may be formed using a conventional deposition technique, such as, for example, CVD, PECVD, ALD, evaporation, sputtering, chemical solution deposition, spin-on deposition, or other like processes.

As used herein, the term "dielectric" refers to an electrical insulator material that can be polarized by an applied electric field. In one or more embodiments, the dielectric layer 108 may comprise any suitable dielectric material known to the skilled artisan. In some embodiments, the dielectric layer 108 comprises a low-refractive index material. In some embodiments, the dielectric material comprises one of more of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$). While the term "silicon oxide" may be used to describe the dielectric layer 108, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. In one or more embodiments, the dielectric layer 108 has a thickness greater than about 300 nm, or greater than about 500 nm, or greater than about 1000 nm.

In one or more embodiments, the dielectric layer 108 is substantially conformal. As used herein, a layer which is "substantially conformal" refers to a layer where the thickness is about the same throughout (e.g., on the top surface of each mesa, on the at least one sidewall 121, and on the bottom surface 123 of the trench 120). A layer which is substantially conformal varies in thickness by less than or equal to about 5%, 2%, 1% or 0.5%.

In one or more embodiments, the dielectric layer 108 forms on the entirety of the at least one sidewall 121 and on the bottom surface 123 of the trench 120. Referring to FIG. 1C and FIG. 5, at operation 508, portions of the dielectric layer 108 may be removed from the bottom surface 123 and at least one sidewall 121 of the trench 120. The portions of the dielectric layer 108 may be removed using a conventional directional etching process, such as dry etching. In one or more embodiments, when portions of the dielectric layer 108 are removed from the bottom surface 123 and at least one sidewall 121 of the trench 120, an exposed portion 125 of the sidewall is formed. The exposed portion 125 may include portions of the n-type layer 106, and the substrate 102 may be exposed in the trench 120.

Figure 1D:
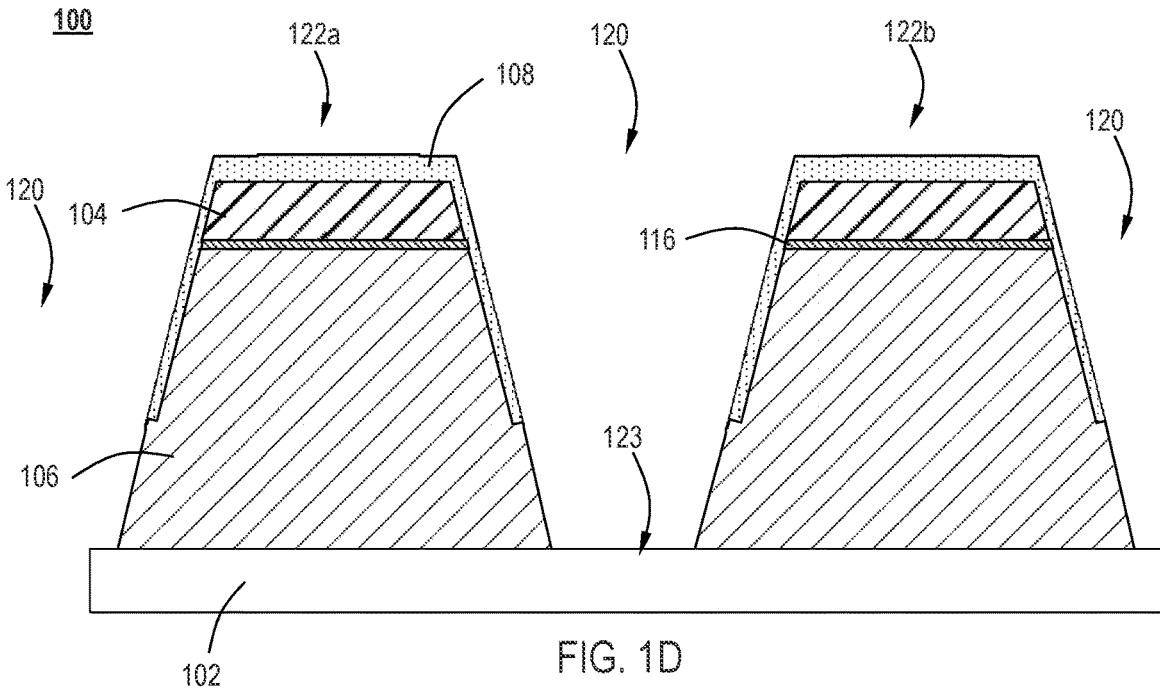
FIG. 1D illustrates a cross-sectional view of an LED device according to one or more embodiments.

Referring to FIG. 1D, after the dielectric layer 108 is deposited, the device 100 is etched to complete the formation of the plurality of mesas 122a, 122b and expose the top surface of the substrate 102. In some embodiments, the top surface of the substrate 102 forms the bottom of the trench 120.

Figures 1E, 1F:
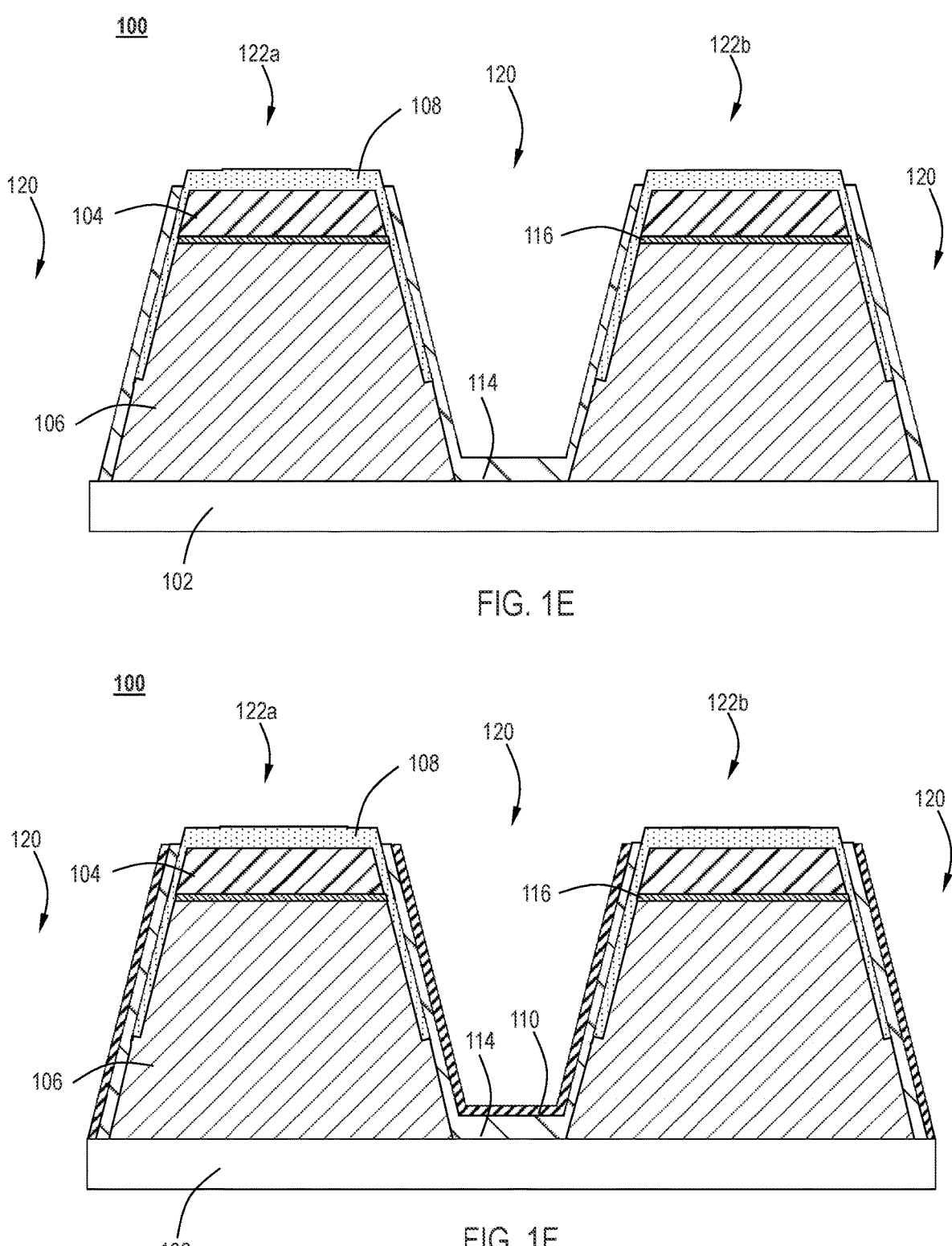
FIG. 1E illustrates a cross-sectional view of an LED device according to one or more embodiments.
FIG. 1F illustrates a cross-sectional view of an LED device according to one or more embodiments.

Referring to FIG. 1E and FIG. 5, at operation 510, in one or more embodiments, a transparent conductive layer 114 is deposited on the plurality of mesas 122a, 122b on the dielectric layer 108 and on the exposed portion 125 of the sidewall of the plurality of mesas 122a, 122b. In one or more embodiments, the transparent conductive layer 114 forms on the bottom surface 123 of the trench 120. In some embodiments, the transparent conductive layer 114 is a conformal layer.

The transparent conductive layer 114 may be formed using a conventional deposition technique, such as, for example, CVD, PECVD, ALD, evaporation, sputtering, chemical solution deposition, spin-on deposition, or other like processes In one or more embodiments, the transparent conductive layer 114 may comprise any suitable material known to the skilled artisan. In some embodiments, the transparent conductive layer 114 comprises zinc oxide (ZnO). ZnO has a high optical transmittance at visible wavelengths with a bandgap of 3.37 eV, which is close to that of GaN (3.4 eV). Having a bandgap close to GaN means that ZnO will absorb the laser beam during subsequent laser lift-off of the substrate in a similar manner to GaN and therefore can be separated from the sapphire substrate 102 during the same laser lift-off step used to separate the GaN layers 106, 104 and it will protect metallic contact layers 110 from the laser lift-off laser beam. The thickness of the ZnO layer could be in the range of tens of nanometer to few hundred nanometers, thick enough to ensure that the laser beam is fully absorbed by the bottom section of this layer and does not reach metallic contact layers 110.

While the term "zinc oxide" may be used to describe the transparent conductive layer 114, the skilled artisan will recognize that the disclosure is not restricted to a particular stoichiometry. In one or more embodiments, the transparent conductive layer 114 has a thickness greater than about 10 nm, or greater than about 20 nm, or greater than about 100 nm. In other embodiments, the transparent conductive layer 114 has a thickness in a range of from 10 nm to 500 nm. Without intending to be bound by theory, it is thought that the optimal thickness of the transparent conductive layer 114 depends upon the laser lift off parameters, such as laser wavelength and energy.

Referring to FIG. 1F and FIG. 5, at operation 512, in one or more embodiments a cathode layer 110, or an n-type contact, is deposited on the exposed portion 125 in the trench 120. In one or more embodiments, the cathode layer 110 may comprise any suitable material known to the skilled artisan. In one or more embodiments, the cathode layer 110 comprises an n-contact material selected from one or more of silver (Ag) and aluminum (Al).

Figures 1G, 1H:
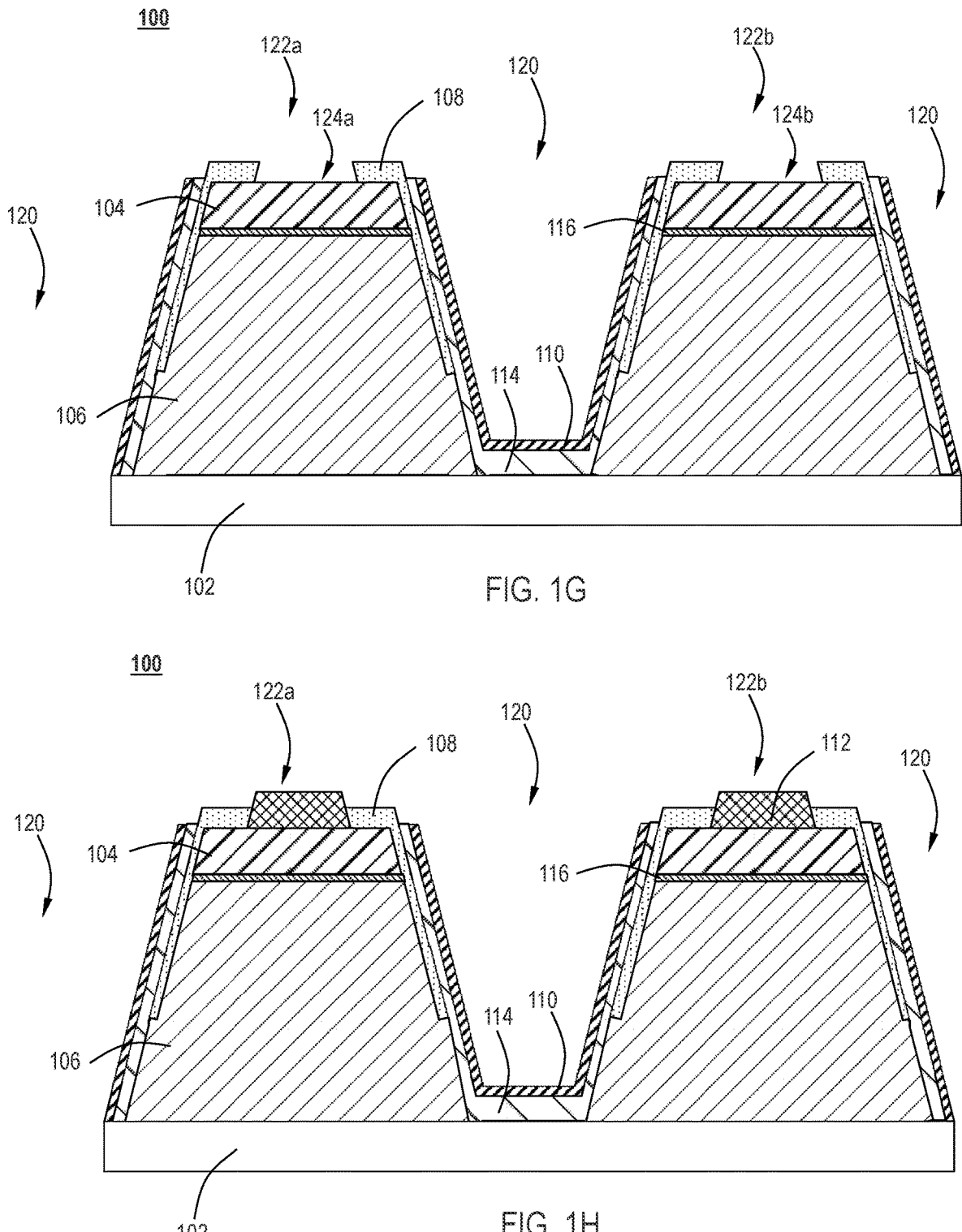
FIG. 1G illustrates a cross-sectional view of an LED device according to one or more embodiments.
FIG. 1H illustrates a cross-sectional view of an LED device according to one or more embodiments.

FIG. 1G, at operation 514 of FIG. 5, shows formation of a contact hole 124 in the dielectric layer 108, exposing a top surface of the n-type layer 104. In some embodiments a first contact hole 124a is formed in the dielectric layer 108 of the first mesa 122a, exposing a top surface of the n-type layer 104. A second contact hole 124b may be formed in the dielectric layer 108 of the second mesa 122b, exposing a top surface of the n-type layer 104. The contact hole 124a, 124b may be formed using a conventional directional etching process, such as dry etching.

Referring to FIG. 1H and FIG. 5, at operation 516, an anode contact metal 112 (or a p-type contact) is deposited in the contact hole 124. In one or more embodiments, the p-type contact metal 112 may comprise any suitable material known to the skilled artisan. In one or more embodiments, the p-type contact metal 112 comprises a p-contact material selected from one or more of aluminum (Al), silver (Ag), gold (Au), platinum (Pt), and palladium (Pd). In specific embodiments, the p-type contact metal 112 comprises silver (Ag). In some embodiments, additional metals may be added in small quantities to the anode contact metal 112 as adhesion promoters. Such adhesion promoters, include, but are not limited to, one or more of nickel (Ni), titanium (Ti), and chromium (Cr).

In one or more embodiments, the anode contact metal 112 and the cathode contact 110 may be made with the same metal in the same deposition and lift-off steps.

Figure 1I:
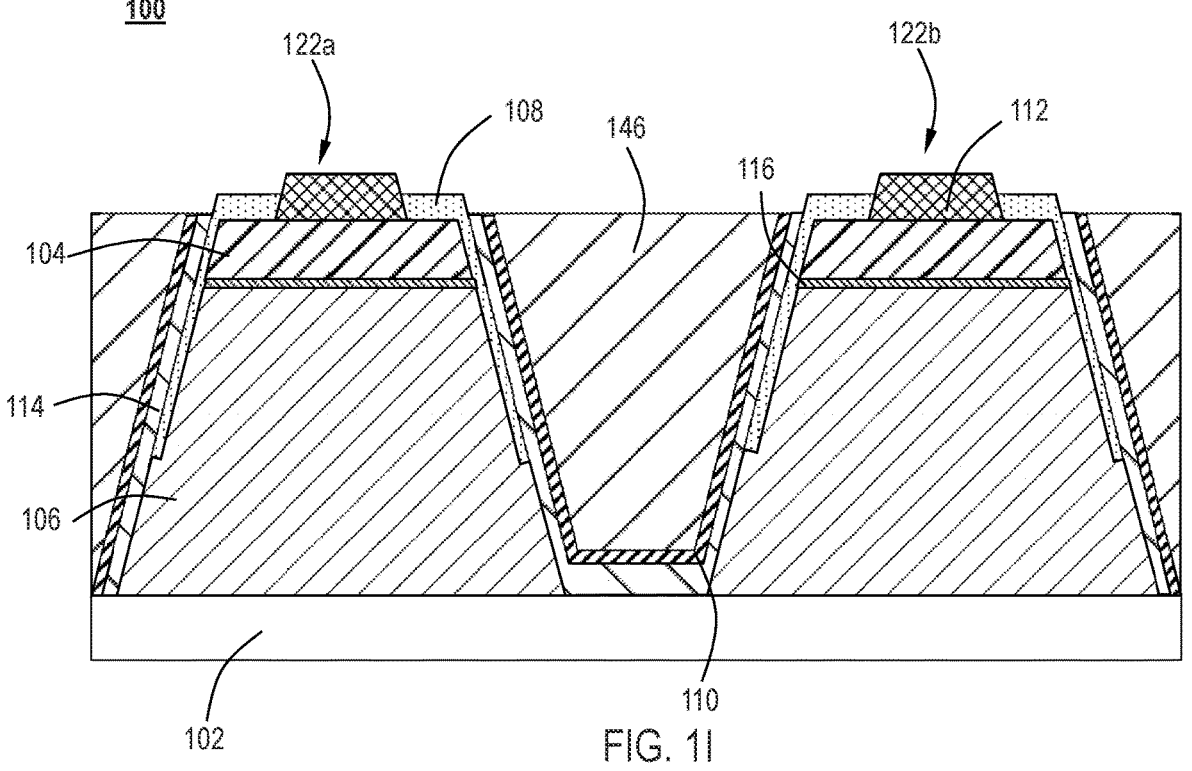
FIG. 1I illustrates a cross-sectional view of an LED device according to one or more embodiments.

Referring to FIG. 1I and FIG. 5, at operation 518, in later stages of processing, the spaces between the mesas 122a, 122b may be filled with an electrically conductive material 146, which could be, for example, electroplated copper (Cu) and, the entire wafer 100 or a piece of the wafer 100 is bonded to a system substrate such as a display backplane to form a system. An array of landing pads may be arranged on the system substrate with dimensions aligned to those of the bonding pads on the LED wafer 100. The landing pads may be connecting to display driver circuitry in the system substrate.

In one or more embodiments, after bonding, the growth substrate 102 is removed using a process such as laser lift-off if the substrate is a UV-transparent material such as sapphire. In one or more embodiments, incorporating the optically transparent and electrically conductive layer 114 resolves the problem of interacting with the laser beam from the laser lift-off process. The transparent conductive layer 114 acts as a protective layer for the metallic contact layers 110 and prohibits laser's interaction with metallic contact layers 110. In one or more embodiments, the laser lift-off laser power is absorbed within the transparent conductive layer 114 before reaching the contact layer 110. Without intending to be bound by theory, it is thought that the transparent conductive layer 114 allows for a thinner, conformal coating of a laser lift-off separable layer covering the sapphire at the bottom of the trench, which can protect the metallic contact layers 110 while still providing good optical contrast between pixels. There is also a low risk of this thin transparent conductive layer 114 cracking and propagating into the pixel active region.

Figure 2:
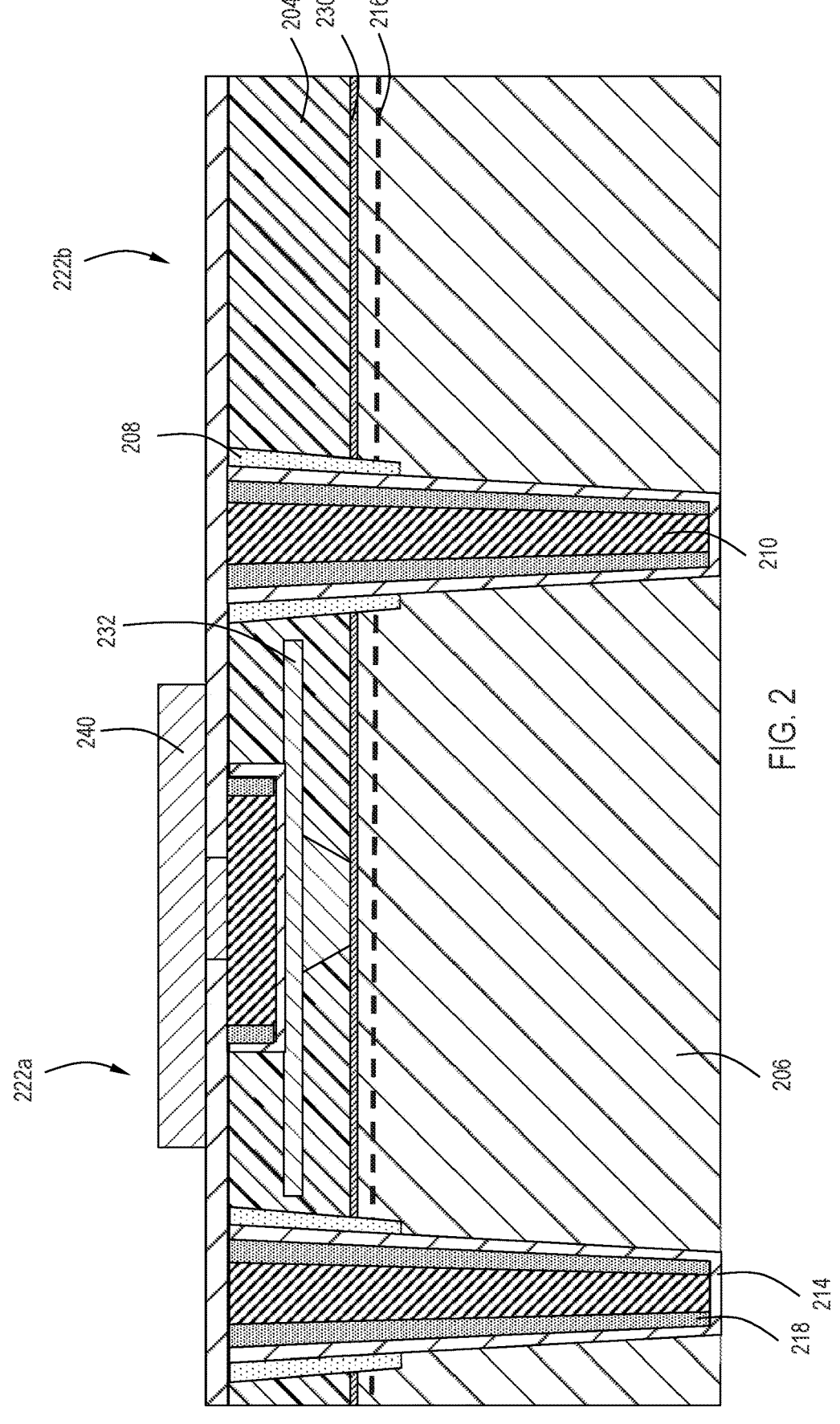
FIG. 2 illustrates a cross-sectional view of an LED device according to one or more alternative embodiments.
Figure 6:
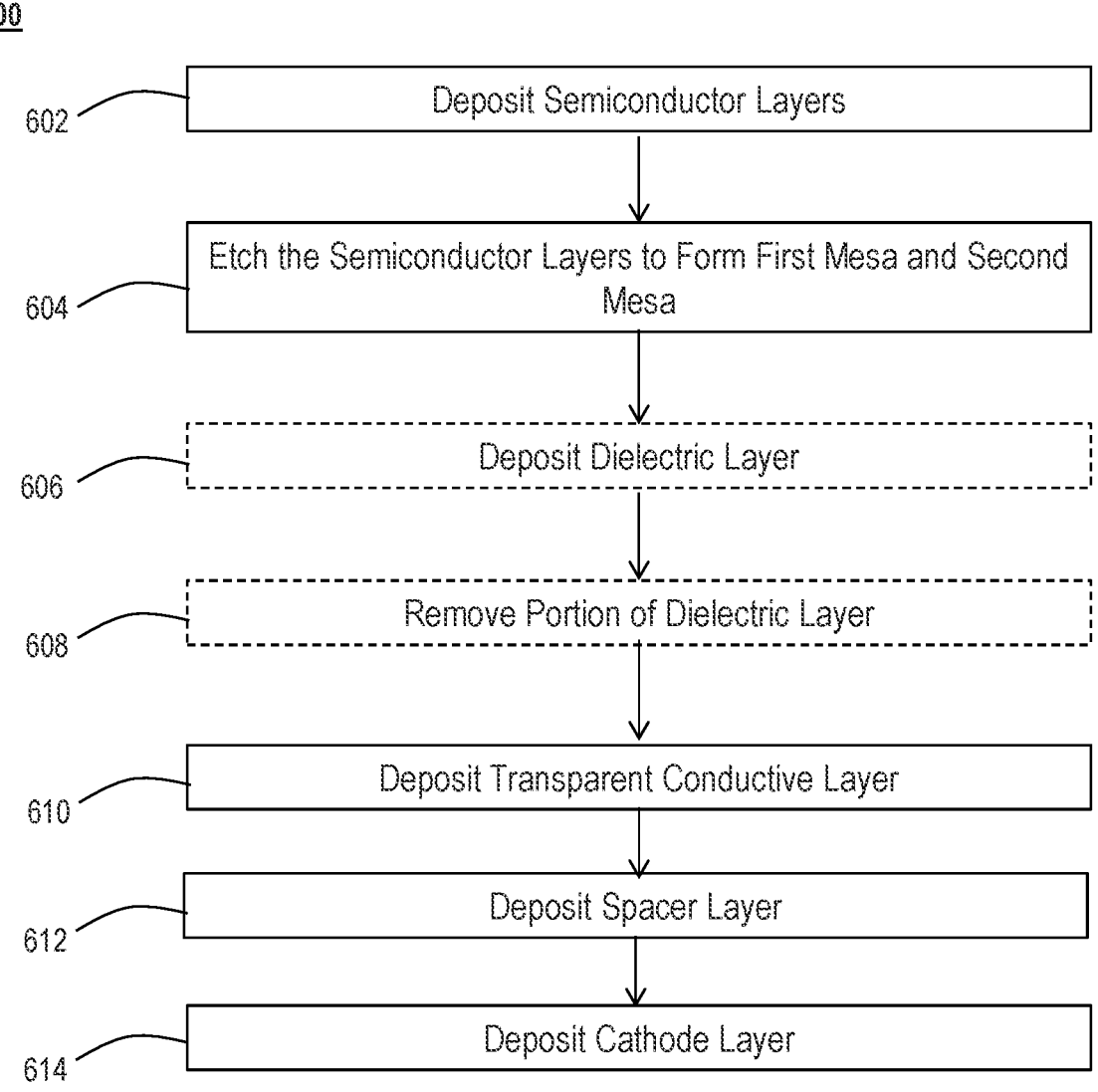
FIG. 6 illustrates a process flow diagram for a method of manufacturing an LED device according to one or more alternative embodiments.

FIG. 2 illustrates an alternative embodiment of an LED device. FIG. 6 illustrates a process flow diagram for a method 600 of forming the LED device. The epitaxial growth illustrated in FIG. 2 at operation 602 differs slightly from that of FIGS. 1A through 1H. Referring to FIG. 2, in one or more embodiments, a transparent conductive oxide layer 230 (e.g., indium tin oxide (ITO)) is grown before the p-type layer 204. At operation 604, the semiconductor layers are then etched to form a plurality of mesas, as described above with respect to FIG. 1B. At operation 606, a dielectric layer 208 can then be deposited on the plurality of mesas, and, at operation 608, a portion of the dielectric layer can be removed, as described above with respect to FIG. 1C. At operation 610, a transparent conductive layer 214 is deposited on the plurality of mesas 222a, 222b on the dielectric layer 208 and on the exposed portion of the sidewall of the trench. In one or more embodiments, the transparent conductive layer 214 forms on the bottom surface of the trench. In some embodiments, the transparent conductive layer 214 is a conformal layer.

The transparent conductive layer 214 may be formed using a conventional deposition technique, such as, for example, CVD, PECVD, ALD, evaporation, sputtering, chemical solution deposition, spin-on deposition, or other like processes In one or more embodiments, the transparent conductive layer 214 may comprise any suitable material known to the skilled artisan. In some embodiments, the transparent conductive layer 214 comprises zinc oxide (ZnO). ZnO has a high optical transmittance at visible wavelengths with a bandgap of 3.37 eV, which is close to that of GaN (3.4 eV). Having a bandgap close to GaN means that ZnO will absorb the laser beam during subsequent laser lift-off of the substrate in a similar manner to GaN and therefore can be separated from the sapphire substrate during the same laser lift-off step used to separate the GaN layers 206, 204, and it will protect metallic contact layers 210 from the laser lift-off laser beam. The thickness of the ZnO layer could be in the range of tens of nanometer to few hundred nanometers, thick enough to ensure that the laser beam is fully absorbed by the bottom section of this layer and does not reach metallic contact layers 210.

While the term "zinc oxide" may be used to describe the transparent conductive layer 114, the skilled artisan will recognize that the disclosure is not restricted to a particular stoichiometry. In one or more embodiments, the transparent conductive layer 214 has a thickness greater than about 10 nm, or greater than about 20 nm, or greater than about 100 nm. In other embodiments, the transparent conductive layer 214 has a thickness in a range of from 10 nm to 500 nm. Without intending to be bound by theory, it is thought that the optimal thickness of the transparent conductive layer 214 depends upon the laser lift off parameters, such as laser wavelength and energy.

In one or more embodiments, with reference to FIG. 2 and FIG. 6, at operation 612, a spacer layer 218 is formed in the trench adjacent to the transparent conductive layer 214. The spacer layer 218 may be formed using a conventional deposition technique, such as, for example, CVD, PECVD, ALD, evaporation, sputtering, chemical solution deposition, spin-on deposition, or other like processes In one or more embodiments, the spacer layer 218 may comprise any suitable dielectric material known to the skilled artisan. In some embodiments, the spacer layer 218 comprises a dielectric material. In one or more embodiments, the spacer layer 218 comprises silicon oxide. In one or more embodiments, the spacer layer 218 has a thickness greater than about 10 nm, or greater than about 20 nm, or greater than about 100 nm. In other embodiments, the spacer layer 218 has a thickness in a range of from 10 nm to 500 nm. The spacer layer 281 thereby provides a total internal reflection (TIR) means to increase side-wall reflectivity.

In one or more embodiments, at operation 614, a cathode layer 210, or an n-type contact, is deposited in the trench directly adjacent to/on the spacer layer 218. In one or more embodiments, the cathode layer 210 may comprise any suitable material known to the skilled artisan. In one or more embodiments, the cathode layer 210 comprises an n-contact material selected from one or more of silver (Ag) and aluminum (Al).

A necessary electrical metal-ZnO (210-214) contact is formed at the bottom of the trench between the cathode layer 210 and the transparent conductive layer 214. Lateral current spreading through the transparent conductive layer 214 guarantees current injection into the semiconductor.

Figure 3:
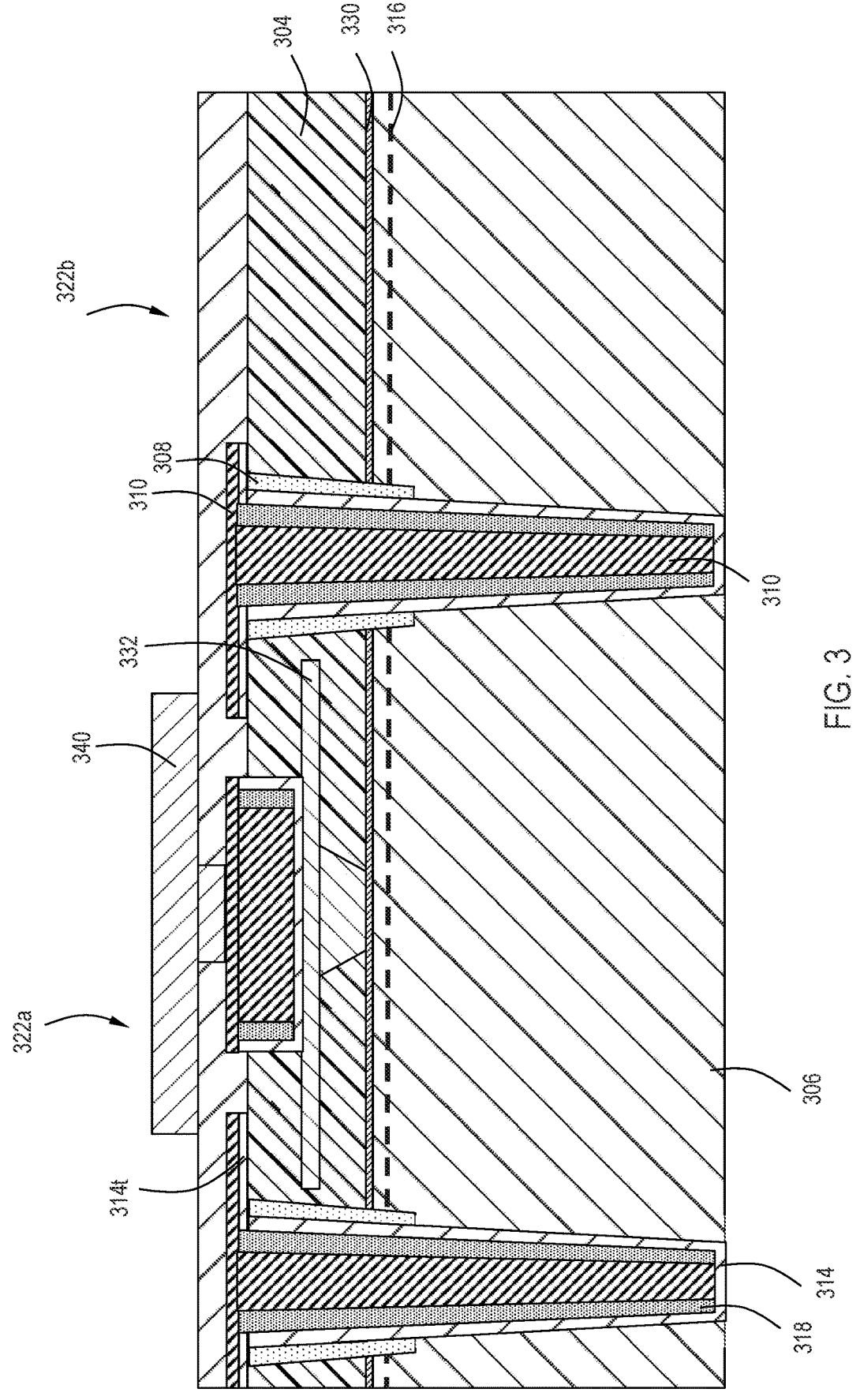
FIG. 3 illustrates a cross-sectional view of an LED device according to one or more alternative embodiments.

FIG. 3 illustrates an alternative embodiment of an LED device. FIG. 6 illustrates a process flow diagram for a method 600 of forming the LED device. The epitaxial growth illustrated in FIG. 3 at operation 602 differs slightly from that of FIGS. 1A through 1H. Referring to FIG. 3, in one or more embodiments, a transparent conductive oxide layer 330 (e.g., indium tin oxide (ITO)) is grown before the p-type layer 304. At operation 604, the semiconductor layers are then etched to form a plurality of mesas, as described above with respect to FIG. 1B. At operation 606, a dielectric layer 308 can then be deposited on the plurality of mesas, and, at operation 608, a portion of the dielectric layer can be removed, as described above with respect to FIG. 1C. At operation 610, a transparent conductive layer 314 is deposited on the plurality of mesas 322a, 322b on the dielectric layer 308 and on the exposed portion of the sidewall of the trench. In one or more embodiments, the transparent conductive layer 314 on the bottom surface of the trench and on the top surface 314t of the trench. In some embodiments, the transparent conductive layer 314, 314t is a conformal layer.

The transparent conductive layer 314 may be formed using a conventional deposition technique, such as, for example, CVD, PECVD, ALD, evaporation, sputtering, chemical solution deposition, spin-on deposition, or other like processes In one or more embodiments, the transparent conductive layer 314 may comprise any suitable material known to the skilled artisan. In some embodiments, the transparent conductive layer 314 comprises zinc oxide (ZnO). ZnO has a high optical transmittance at visible wavelengths with a bandgap of 3.37 eV, which is close to that of GaN (3.4 eV). Having a bandgap close to GaN means that ZnO will absorb the laser beam during subsequent laser lift-off of the substrate in a similar manner to GaN and therefore can be separated from the sapphire substrate during the same laser lift-off step used to separate the GaN layers 306, 304, and it will protect metallic contact layers 310 from the laser lift-off laser beam. The thickness of the ZnO layer could be in the range of tens of nanometer to few hundred nanometers, thick enough to ensure that the laser beam is fully absorbed by the bottom section of this layer and does not reach metallic contact layers 310.

In one or more embodiments, the transparent conductive layer 314 has a thickness greater than about 10 nm, or greater than about 20 nm, or greater than about 100 nm. In other embodiments, the transparent conductive layer 314 has a thickness in a range of from 10 nm to 500 nm. Without intending to be bound by theory, it is thought that the optimal thickness of the transparent conductive layer 314 depends upon the laser lift off parameters, such as laser wavelength and energy.

In one or more embodiments, with reference to FIG. 3 and FIG. 6, at operation 612, a spacer layer 318 is formed in the trench adjacent to the transparent conductive layer 314. The spacer layer 318 may be formed using a conventional deposition technique, such as, for example, CVD, PECVD, ALD, evaporation, sputtering, chemical solution deposition, spin-on deposition, or other like processes In one or more embodiments, the spacer layer 318 may comprise any suitable dielectric material known to the skilled artisan. In some embodiments, the spacer layer 318 comprises a dielectric material. In one or more embodiments, the spacer layer 318 comprises silicon oxide. In one or more embodiments, the spacer layer 318 has a thickness greater than about 10 nm, or greater than about 20 nm, or greater than about 100 nm. In other embodiments, the spacer layer 318 has a thickness in a range of from 10 nm to 500 nm. The spacer layer 318 thereby provides a total internal reflection (TIR) means to increase side-wall reflectivity.

In one or more embodiments, at operation 614, a cathode layer 310, or an n-type contact, is deposited in the trench directly adjacent to/on the spacer layer 318. In one or more embodiments, the cathode layer 310 may comprise any suitable material known to the skilled artisan. In one or more embodiments, the cathode layer 310 comprises an n-contact material selected from one or more of silver (Ag) and aluminum (Al).

A necessary electrical metal-ZnO (310-314) contact is formed at the bottom of the trench and is formed at the top of the trench (310t-314t) between the cathode layer 310 and the transparent conductive layer 314. Lateral current spreading through the transparent conductive layer 314 guarantees current injection into the semiconductor.

Figure 4:
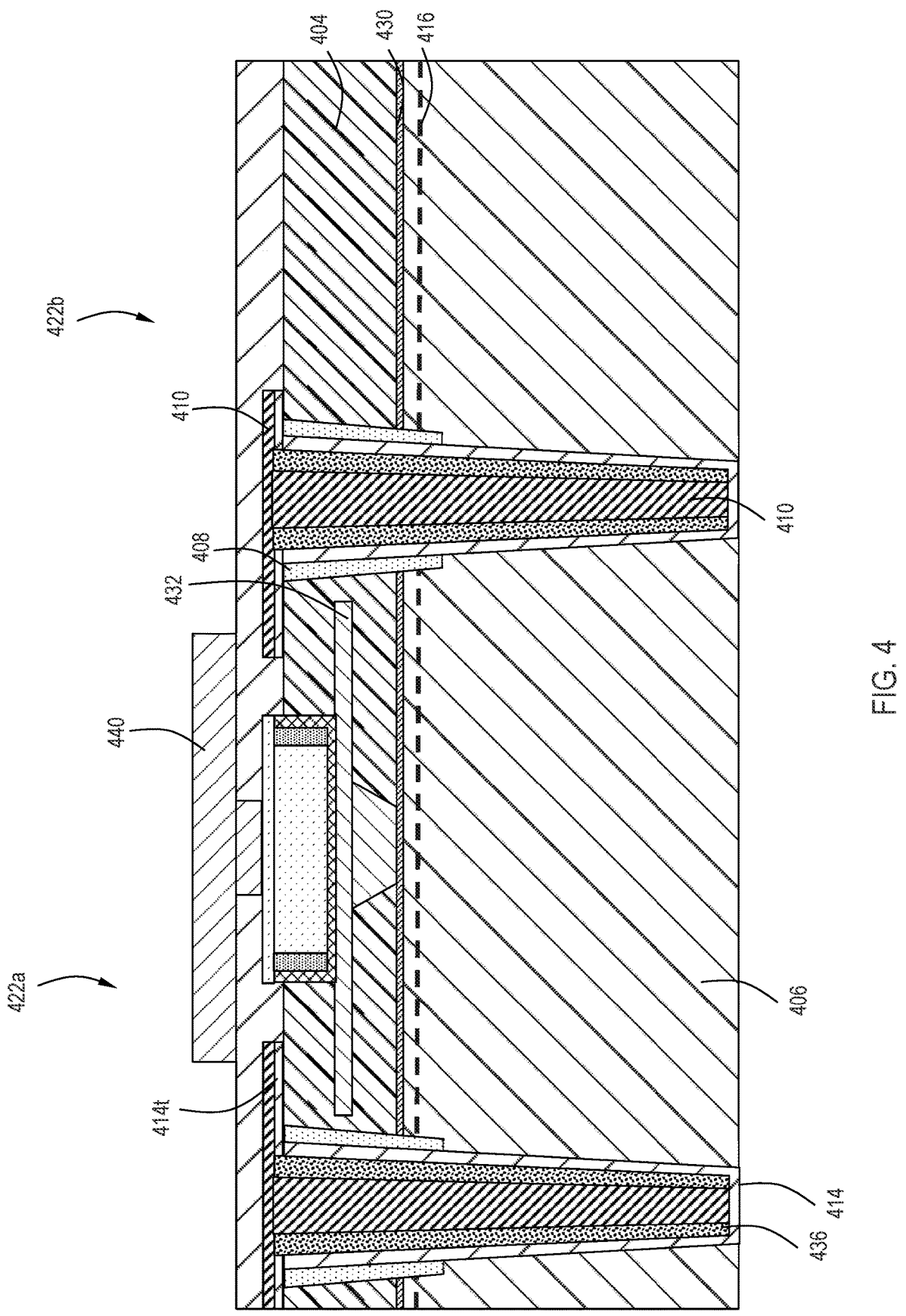
FIG. 4 illustrates a cross-sectional view of an LED device according to one or more alternative embodiments.
Figure 7:
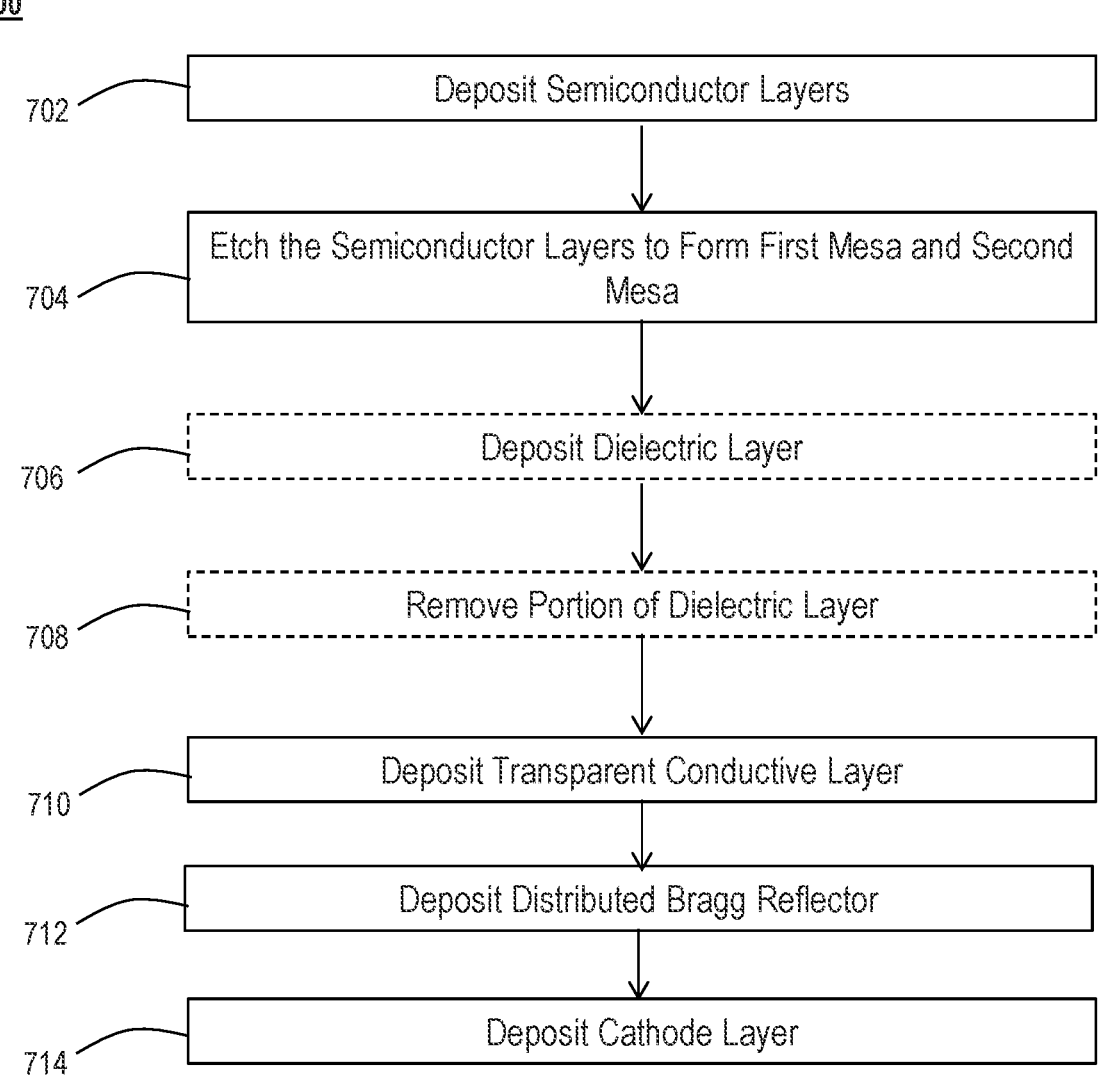
FIG. 7 illustrates a process flow diagram for a method of manufacturing an LED device according to one or more alternative embodiments.

FIG. 4 illustrates an alternative embodiment of an LED device. FIG. 7 illustrates a process flow diagram for a method 700 of forming the LED device. The epitaxial growth illustrated in FIG. 4 at operation 702 differs slightly from that of FIGS. 1A through 1H. Referring to FIG. 4, in one or more embodiments, a transparent conductive oxide layer 430 (e.g., indium tin oxide (ITO)) is deposited before the p-type layer 404. At operation 704, the semiconductor layers are then etched to form a plurality of mesas, as described above with respect to FIG. 1B. At operation 706, a dielectric layer 408 can then be deposited on the plurality of mesas, and, at operation 708, a portion of the dielectric layer 408 can be removed, as described above with respect to FIG. 1C. At operation 710, a transparent conductive layer 414 is deposited on the plurality of mesas 422a, 422b on the dielectric layer 408 and on the exposed portion of the sidewall of the trench. In one or more embodiments, the transparent conductive layer 414 on the bottom surface of the trench and on the top surface 414t of the trench. In some embodiments, the transparent conductive layer 414, 414t is a conformal layer.

The transparent conductive layer 414 may be formed using a conventional deposition technique, such as, for example, CVD, PECVD, ALD, evaporation, sputtering, chemical solution deposition, spin-on deposition, or other like processes In one or more embodiments, the transparent conductive layer 414 may comprise any suitable material known to the skilled artisan. In some embodiments, the transparent conductive layer 414 comprises zinc oxide (ZnO). ZnO has a high optical transmittance at visible wavelengths with a bandgap of 3.37 eV, which is close to that of GaN (3.4 eV). Having a bandgap close to GaN means that ZnO will absorb the laser beam during subsequent laser lift-off of the substrate in a similar manner to GaN and therefore can be separated from the sapphire substrate during the same laser lift-off step used to separate the GaN layers 406, 404, and it will protect metallic contact layers 410 from the laser lift-off laser beam. The thickness of the ZnO layer could be in the range of tens of nanometer to few hundred nanometers, thick enough to ensure that the laser beam is fully absorbed by the bottom section of this layer and does not reach metallic contact layers 410.

In one or more embodiments, the transparent conductive layer 414 has a thickness greater than about 10 nm, or greater than about 20 nm, or greater than about 100 nm. In other embodiments, the transparent conductive layer 414 has a thickness in a range of from 10 nm to 500 nm. Without intending to be bound by theory, it is thought that the optimal thickness of the transparent conductive layer 414 depends upon the laser lift off parameters, such as laser wavelength and energy.

In one or more embodiments, with reference to FIG. 4 and FIG. 7, at operation 712, a distributed Bragg reflector (DBR) 436 is formed in the trench adjacent to the transparent conductive layer 414. The distributed Bragg reflector (DBR) 436 may be formed using a conventional deposition technique, such as, for example, CVD, PECVD, ALD, evaporation, sputtering, chemical solution deposition, spin-on deposition, or other like processes.

Distributed Bragg reflectors are typically made of multi-layers of alternating thin film materials of different refractive index, wherein high reflectance is one of the key attributes. A distributed Bragg reflector or mirror is a structure formed from a multilayer stack of alternating thin film materials with varying refractive index, for example high- and low-index films. Bragg reflectors must have high reflectance. In some embodiments, the distributed Bragg reflector 436 has a thickness of at least 0.2 microns.

In one or more embodiments, the distributed Bragg reflector (DBR) 436 may comprise any suitable dielectric material known to the skilled artisan. In some embodiments, the distributed Bragg reflector (DBR) 436 comprises a sequence of alternating layers of Ill-nitride materials with different refractive indices, such as, but not limited to, gallium nitride (GaN) and aluminum gallium nitride (AlGaN), or aluminum indium nitride (AlInN), or mixtures thereof. In one or more embodiments, the DBR 436 comprises silicon oxide.

In one or more embodiments, the distributed Bragg reflector (DBR) 436 has a thickness of at least 0.2 microns. In other embodiments, the distributed Bragg reflector (DBR) 436 has a thickness in a range of from 0.2 microns to 5 microns. In other embodiments, the distributed Bragg reflector (DBR) 436 has a thickness in a range of from 10 nm to 500 nm. The distributed Bragg reflector (DBR) 436 thereby provides a total internal reflection (TIR) means to increase side-wall reflectivity.

In one or more embodiments, at operation 714, a cathode layer 410, or an n-type contact, is deposited in the trench directly adjacent to/on the distributed Bragg reflector (DBR) 436. In one or more embodiments, the cathode layer 410 may comprise any suitable material known to the skilled artisan. In one or more embodiments, the cathode layer 410 comprises an n-contact material selected from one or more of silver (Ag) and aluminum (Al).

A necessary electrical metal-ZnO (410-414) contact is formed at the bottom of the trench and is formed at the top of the trench (410t-414t) between the cathode layer 410 and the transparent conductive layer 414. Lateral current spreading through the transparent conductive layer 314 guarantees current injection into the semiconductor.

EMBODIMENTS

Various embodiments are listed below. It will be understood that the embodiments listed below may be combined with all aspects and other embodiments in accordance with the scope of the invention.

Embodiment (a). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; a cathode layer in the trench on the transparent conductive layer; and a p-type contact on the top surface of the mesa.

Embodiment (b). The LED device of embodiment (a), wherein the transparent conductive layer comprises zinc oxide.

Embodiment (c). The LED device of embodiment (a) to embodiment (b), wherein the transparent conductive layer has a thickness in a range of from 10 nm to 500 nm.

Embodiment (d). The LED device of embodiment (a) to embodiment (c), further comprising a dielectric layer on a portion of the mesa.

Embodiment (e). The LED device of embodiment (a) to embodiment (d), wherein the dielectric layer comprises a low-refractive index material.

Embodiment (f). The LED device of embodiment (a) to embodiment (e), wherein the low-refractive index material comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

Embodiment (g). The LED device of embodiment (a) to embodiment (f), wherein the transparent conductive layer is a CVD transparent conductive layer or a sputtered transparent conductive layer.

Embodiment (h). The LED device of embodiment (a) to embodiment (g), wherein the cathode layer comprises one or more of silver (Ag) and aluminum (Al).

Embodiment (i). The LED device of embodiment (a) to embodiment (h), wherein the semiconductor layers are epitaxial semiconductor layers having a thickness at least 1 micron.

Embodiment (j). A method of manufacturing a light emitting diode (LED) device comprising: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a cathode layer in the trench and on the transparent conductive layer; and forming a p-type contact on the top surface of the at least one mesa.

Embodiment (k). The method of embodiment (j), wherein the transparent conductive layer comprises zinc oxide.

Embodiment (l). The method of embodiment (j) to embodiment (k), wherein the transparent conductive layer has a thickness in a range of from 10 nm to 500 nm.

Embodiment (m). The method of embodiment (j) to embodiment (l), further comprising depositing a dielectric layer on a portion of the mesa.

Embodiment (n). The method of embodiment (j) to embodiment (m), wherein the dielectric layer comprises a low-refractive index material.

Embodiment (o). The method of embodiment (j) to embodiment (n), wherein the low-refractive index material comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

Embodiment (p). The method of embodiment (j) to embodiment (o), wherein the transparent conductive layer is a CVD transparent conductive layer or a sputtered transparent conductive layer.

Embodiment (q). The method of embodiment (j) to embodiment (p), wherein the cathode layer comprises one or more of silver (Ag) and aluminum (Al).

Embodiment (r). The method of embodiment (j) to embodiment (q), wherein the semiconductor layers are epitaxial semiconductor layers having a thickness at least 1 micron.

Embodiment (s). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric, on the at least one side wall of the mesa and in the trench; a cathode layer on the zinc oxide layer; and a p-contact on the top surface of the mesa.

Embodiment (t). The LED device of embodiment (s), wherein the cathode layer comprises one or more of silver (Ag) and aluminum (Al).

Embodiment (u). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; a spacer layer on the transparent conductive layer; a cathode layer on the dielectric spacer layer; and a p-type contact on the top surface of the mesa.

Embodiment (v). The LED device of embodiment (u), wherein the transparent conductive layer comprises zinc oxide.

Embodiment (w). The LED device of embodiment (u) to embodiment (v), wherein the transparent conductive layer has a thickness in a range of from 10 nm to 500 nm.

Embodiment (x). The LED device of embodiment (u) to embodiment (w), wherein the spacer layer comprises silicon oxide.

Embodiment (y). The LED device of embodiment (u) to embodiment (x), wherein the spacer layer has a thickness in a range of from 10 nm to 500 nm.

Embodiment (z). The LED device of embodiment (u) to embodiment (y), further comprising a dielectric layer on a portion of the mesa.

Embodiment (aa). The LED device of embodiment (u) to embodiment (z), further comprising the transparent conductive layer on a top surface of the dielectric layer and the cathode layer on a top surface of the transparent conductive layer.

Embodiment (bb). The LED device of embodiment (u) to embodiment (aa), wherein the transparent conductive layer is a CVD transparent conductive layer or a sputtered transparent conductive layer.

Embodiment (cc). The LED device of embodiment (u) to embodiment (bb), wherein the cathode layer comprises one or more of silver (Ag) and aluminum (Al).

Embodiment (dd). The LED device of embodiment (u) to embodiment (cc), wherein the semiconductor layers are epitaxial semiconductor layers having a thickness at least 1 micron.

Embodiment (ee). A method of manufacturing a light emitting diode (LED) device comprising: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a spacer layer on the transparent conductive layer; depositing a cathode layer on the transparent conductive layer; and forming a p-type contact on the top surface of the at least one mesa.

Embodiment (ff). The method of embodiment (ee), wherein the transparent conductive layer comprises zinc oxide.

Embodiment (gg). The method of embodiment (ee) to embodiment (ff), wherein the transparent conductive layer has a thickness in a range of from 10 nm to 500 nm.

Embodiment (hh). The method of embodiment (ee) to embodiment (gg), wherein the spacer layer comprises silicon oxide.

Embodiment (ii). The method of embodiment (ee) to embodiment (hh), wherein the spacer layer has a thickness in a range of from 10 nm to 500 nm.

Embodiment (jj). The method of embodiment (ee) to embodiment (ii), further comprising depositing a dielectric layer on a portion of the mesa.

Embodiment (kk). The method of embodiment (ee) to embodiment (jj), further comprising forming the transparent conductive layer on a top surface of the dielectric layer and forming the cathode layer on a top surface of the transparent conductive layer.

Embodiment (ll). The method of embodiment (ee) to embodiment (kk), wherein the cathode layer comprises one or more of silver (Ag) and aluminum (Al).

Embodiment (mm). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric layer, on the at least one side wall of the mesa, and in the trench; a spacer layer on the zinc oxide layer; a cathode layer on the spacer layer; and a p-contact on the top surface of the mesa.

Embodiment (nn). The LED device of embodiment (mm), wherein the spacer layer comprises silicon oxide.

Embodiment (oo). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench have a bottom surface; a transparent conductive layer on the at least one side wall and in the trench; distributed Bragg reflector (DBR) on the transparent conductive layer; a cathode layer on the dielectric spacer layer; and a p-type contact on the top surface of the mesa.

Embodiment (pp). The LED device of embodiment (oo), wherein the transparent conductive layer comprises zinc oxide.

Embodiment (qq). The LED device of embodiment (oo) to embodiment (pp), wherein the transparent conductive layer has a thickness in a range of from 10 nm to 500 nm.

Embodiment (rr). The LED device of embodiment (oo) to embodiment (qq), wherein the distributed Bragg reflector (DBR) comprises silicon oxide.

Embodiment (ss). The LED device of embodiment (oo) to embodiment (rr), wherein the distributed Bragg reflector (DBR) has a thickness of at least 0.2 microns.

Embodiment (tt). The LED device of embodiment (oo) to embodiment (ss), further comprising a dielectric layer on a portion of the mesa.

Embodiment (uu). The LED device of embodiment (oo) to embodiment (tt) wherein the dielectric layer comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

Embodiment (vv). The LED device of embodiment (oo) to embodiment (uu), wherein the transparent conductive layer is a CVD transparent conductive layer or a sputtered transparent conductive layer.

Embodiment (ww). The LED device of embodiment (oo) to embodiment (vv), wherein the cathode layer comprises one or more of silver (Ag) and aluminum (Al).

Embodiment (xx). The LED device of embodiment (oo) to embodiment (ww), wherein the semiconductor layers are epitaxial semiconductor layers having a thickness at least 1 micron.

Embodiment (yy). A method of manufacturing a light emitting diode (LED) device comprising: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a transparent conductive layer on the at least one side wall, on the top surface of the at least one mesa, and in the trench; depositing a distributed Bragg reflector (DBR) on the transparent conductive layer; depositing a cathode layer on the transparent conductive layer; and forming a p-type contact on the top surface of the at least one mesa.

Embodiment (zz). The method of embodiment (yy), wherein the transparent conductive layer comprises zinc oxide.

Embodiment (aaa). The method of embodiment (yy) to embodiment (zz), wherein the transparent conductive layer has a thickness in a range of from 10 nm to 500 nm.

Embodiment (bbb). The method of embodiment (yy) to embodiment (aaa), wherein the distributed Bragg reflector (DBR) comprises silicon oxide.

Embodiment (ccc). The method of embodiment (yy) to embodiment (bbb), wherein the distributed Bragg reflector (DBR) has a thickness in a range of from 10 nm to 500 nm.

Embodiment (ddd). The method of embodiment (yy) to embodiment (ccc), further comprising depositing a dielectric layer on a portion of the mesa.

Embodiment (eee). The method of embodiment (yy) to embodiment (ddd), wherein the dielectric layer comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

Embodiment, (fff). The method of embodiment (yy) to embodiment (eee), wherein the cathode layer comprises one or more of silver (Ag) and aluminum (Al).

Embodiment (ggg). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench having a bottom surface; a dielectric layer on a portion of the mesa on the at least one side wall and on the top surface of the mesa; a zinc oxide layer on the dielectric layer, on the at least one side wall of the mesa, and in the trench; a distributed Bragg reflector (DBR) on the zinc oxide layer; a cathode layer on the spacer layer; and a p-contact on the top surface of the mesa.

Embodiment (hhh). The LED device of embodiment (ggg), wherein the cathode layer comprises one or more of silver (Ag) and aluminum (Al).

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
   a mesa comprising semiconductor layers, the semiconductor layers including an N-type layer, an active layer, and a P-type layer, the P-type layer having a top surface and at least one side surface, the active layer having a top surface and at least one side surface, and the N-type layer having a top surface and at least one side surface, the mesa having a top surface and at least one side wall, the at least one side wall formed by the N-type layer, the active layer, and the P-type layer, the at least one side wall defining a trench having a bottom surface;

a transparent conductive layer on the at least one side wall and on the bottom surface of the trench;
   a dielectric layer disposed along the side surface of the P-type layer, the side surface of the active layer, and a first portion of the side surface of the N-type layer, the dielectric layer is disposed between the transparent conductive layer and the side surface of the P-type layer, the side surface of the active layer, and the first portion of the side surface of the N-type layer;
   a cathode layer disposed along the transparent conductive layer; and
   a p-type contact on the top surface of the mesa.

2. The LED device of claim 1, wherein the transparent conductive layer comprises zinc oxide.

3. The LED device of claim 2, wherein the transparent conductive layer has a thickness in a range of from 10 nm to 500 nm.

4. The LED device of claim 1, wherein the dielectric layer comprises a low-refractive index material.

5. The LED device of claim 4, wherein the low-refractive index material comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

6. The LED device of claim 1, wherein the transparent conductive layer is a CVD transparent conductive layer or a sputtered transparent conductive layer.

7. The LED device of claim 1, wherein the cathode layer comprises one or more of silver (Ag) and aluminum (Al).

8. The LED device of claim 1, wherein the semiconductor layers are epitaxial semiconductor layers having a thickness at least 1 micron.

9. A method of manufacturing the light emitting diode (LED) device of claim 1, the method comprising:
   depositing a plurality of the semiconductor layers including the N-type layer, the active layer, and the P-type layer on a substrate;
   etching a portion of the plurality of semiconductor layers to form the at least one trench and the at least one mesa defining a pixel, the at least one mesa comprising the semiconductor layers, the top surface and the at least one side wall;
   depositing the dielectric layer on the side surface of the P-type layer, the side surface of the active layer, and the first portion of the side surface of the N-type layer;
   etching to remove the dielectric layer from the bottom surface of the trench and to form an exposed bottom surface of the trench, and to remove a second portion of the side surface of the N-type layer to form an exposed portion of the side surface of the N-type layer;
   depositing the transparent conductive layer on the dielectric layer, on the exposed portion of the side surface of the N-type layer, on the top surface of the at least one mesa, and on the bottom surface of the trench;
   depositing the cathode layer in the trench and on the transparent conductive layer; and
   forming the p-type contact on the top surface of the at least one mesa.

10. The method of claim 9, wherein the transparent conductive layer comprises zinc oxide.

11. The method of claim 10, wherein the transparent conductive layer has a thickness in a range of from 10 nm to 500 nm.

12. The method of claim 9, wherein the dielectric layer comprises a low-refractive index material.

13. The method of claim 12, wherein the low-refractive index material comprises a material selected from the group consisting of silicon nitride (SiN), titanium oxide (TiO$_x$), niobium oxide (NbO$_x$), aluminum oxide (AlO$_x$), hafnium oxide (HfO$_x$), tantalum oxide (TaO$_x$), aluminum nitride (AlN), silicon oxide (SiO$_x$), and hafnium-doped silicon dioxide (HfSiO$_x$).

14. The method of claim 9, wherein the transparent conductive layer is a CVD transparent conductive layer or a sputtered transparent conductive layer.

15. The method of claim 9, wherein the cathode layer comprises one or more of silver (Ag) and aluminum (Al).

16. The method of claim 9, wherein the semiconductor layers are epitaxial semiconductor layers having a thickness at least 1 micron.

17. A light emitting diode (LED) device comprising:

a mesa comprising semiconductor layers, the semiconductor layers including an N-type layer, an active layer, and a P-type layer, the P-type layer having a top surface and at least one side surface, the active layer having a top surface and at least one side surface, and the N-type layer having a top surface and at least one side surface, the mesa having a top surface and at least one side wall, the at least one side wall formed by the N-type layer, the active layer, and the P-type layer, the at least one side wall defining a trench having a bottom surface;

a dielectric layer disposed along the side surface of the P-type layer, the side surface of the active layer, a first portion of the side surface of the N-type layer, and on the top surface of the mesa;

a zinc oxide layer on the dielectric layer, on a second portion of the side surface of the N-type layer, and on the bottom surface of the trench, the dielectric layer disposed between the zinc oxide layer and the side surface of the P-type layer, the side surface of the active layer, and the first portion of the side surface of the N-type layer;

a cathode layer on the zinc oxide layer; and a p-contact on the top surface of the mesa.

18. The LED device of claim 17, wherein the cathode layer comprises one or more of silver (Ag) and aluminum (Al).

19. The LED device of claim 17, wherein the zinc oxide layer is a CVD transparent conductive layer or a sputtered transparent conductive layer.

* * * * *